United States Patent
Park et al.

(10) Patent No.: US 9,362,458 B2
(45) Date of Patent: Jun. 7, 2016

(54) LIGHT EMITTING DIODE AND METHOD OF FABRICATING THE SAME

(71) Applicant: Seoul Viosys Co., Ltd., Ansan-si (KR)

(72) Inventors: Ju Yong Park, Ansan-si (KR); Jong Kyun You, Ansan-si (KR); Chang Yeon Kim, Ansan-si (KR)

(73) Assignee: Seoul Viosys Co., Ltd., Ansan-si (KR)

(*) Notice: Subject to any disclaimer, the term of this patent is extended or adjusted under 35 U.S.C. 154(b) by 19 days.

(21) Appl. No.: 14/474,982

(22) Filed: Sep. 2, 2014

(65) Prior Publication Data

US 2015/0060923 A1     Mar. 5, 2015

(30) Foreign Application Priority Data

Aug. 30, 2013   (KR) .................. 10-2013-0104260

(51) Int. Cl.
| | | |
|---|---|---|
| *H01L 33/00* | (2010.01) | |
| *H01L 33/40* | (2010.01) | |
| *H01L 33/32* | (2010.01) | |
| *H01L 33/38* | (2010.01) | |

(52) U.S. Cl.
CPC ............ *H01L 33/405* (2013.01); *H01L 33/32* (2013.01); *H01L 33/387* (2013.01); *H01L 2933/0016* (2013.01)

(58) Field of Classification Search
CPC .................. H01L 33/405; H01L 33/32; H01L 2933/0016; H01L 33/387
See application file for complete search history.

(56) References Cited

U.S. PATENT DOCUMENTS

| | | | | |
|---|---|---|---|---|
| 8,659,045 B2 * | 2/2014 | Tsai | ........................ | H01L 33/14 257/99 |
| 2007/0102693 A1 * | 5/2007 | Nagai | ....................... | F21K 9/00 257/13 |
| 2010/0051978 A1 * | 3/2010 | Katsuno | .................. | H01L 33/32 257/94 |
| 2012/0213242 A1 * | 8/2012 | Tanaka | ................... | B82Y 20/00 372/50.1 |

FOREIGN PATENT DOCUMENTS

KR    10-2012-0080282      7/2012

* cited by examiner

*Primary Examiner* — Victor A Mandala

(74) *Attorney, Agent, or Firm* — H.C. Park & Associates, PLC

(57) ABSTRACT

A light emitting diode and a method of fabricating the same, the light emitting diode including: a gallium nitride-based compound semiconductor layer; a first metal layer including Mg and disposed in the form of islands that are in ohmic contact with the gallium nitride-based compound semiconductor layer; a second metal layer including Ni, covering the first metal layer, and contacting the gallium nitride-based compound semiconductor layer between the islands of the first metal layer; and a reflective metal layer covering the second metal layer.

14 Claims, 2 Drawing Sheets

LIGHT EMITTING DIODE AND METHOD OF FABRICATING THE SAME

CROSS-REFERENCE TO RELATED APPLICATION

This application claims priority from and the benefit of Korean Patent Application No. 10-2013-0104260, filed on Aug. 30, 2013, which is hereby incorporated by reference for all purposes as if fully set forth herein.

BACKGROUND

1. Field

Aspects of the present invention relate to a light emitting diode and a method of fabricating the same, and more particularly, to a light emitting diode having an ohmic reflective structure, and a method of fabricating the same.

2. Discussion of the Background

Generally, since a nitride of a group-III element, such as a gallium nitride (GaN), an aluminum nitride (AlN), or the like, has excellent thermal stability and a direct transition-type energy band structure, it has been recently prominent as a material for a light emitting device of visible and infrared light. Particularly, blue and green light emitting devices using indium gallium nitride (InGaN) have been utilized in various applications such as a large scale natural color flat panel display, a signal lamp, indoor lighting, a high density light source, a high resolution output system, optical communication, and the like.

Since it is difficult to fabricate a homogeneous substrate on which a nitride semiconductor layer formed of the nitride of the group-III element may be grown, the nitride semiconductor layer is grown on a heterogeneous substrate having a crystal structure similar to that of the nitride semiconductor layer, by a process such as metal organic chemical vapor deposition (MOVCD), molecular beam epitaxy (MBE), or the like. As the heterogeneous substrate, a sapphire substrate having a structure of a hexagonal system is mainly used. However, since sapphire is an electrical non-conductor, it limits the structure of a light emitting diode. Therefore, recently, a method of fabricating a high efficiency light emitting diode having a vertical-type structure, by growing epitaxial layers such as a nitride semiconductor layers on a heterogeneous substrate, such as the sapphire substrate, bonding a support layer to the epitaxial layers, and then separating the heterogeneous substrate using laser lift-off technology, or the like, has been developed. For example, Korean Patent Laid-Open Publication No. 10-2012-0080282 has disclosed a high efficiency light emitting diode having a vertical-type structure.

The high efficiency light emitting diode having the vertical-type structure generally includes a metal reflective layer, such as an Al or Ag reflective layer, disposed beneath a p-type semiconductor layer and having a high reflectivity, and a barrier metal layer protecting the metal semiconductor layer. Since the Al or Ag reflective layer has a relatively high reflectivity, it is often used as a reflective layer in a light emitting diode having a vertical-type structure or a flip-type structure. However, in the Al or Ag reflective layer, it is difficult to accomplish or maintain good ohmic characteristics, and reflectivity is easily decreased due thermal deformation.

Therefore, an ohmic reflective structure having good ohmic contact characteristics and improved thermal stability is needed.

BRIEF SUMMARY OF THE INVENTION

An aspect of the present invention provides a light emitting diode including an ohmic reflective structure having good ohmic contact characteristics and improved thermal stability, and a method of fabricating the same.

According to an exemplary embodiment of the present invention, there is provided a light emitting diode including: a gallium nitride-based compound semiconductor layer; a first metal layer disposed in the form of islands that are in ohmic contact with the gallium nitride-based compound semiconductor layer; a second metal layer covering the first metal layer and contacting the gallium nitride-based compound semiconductor layer between the islands of the first metal layer; and a reflective metal layer covering the second metal layer. The first metal layer may include Mg, and the second metal layer may include Ni.

Stable ohmic characteristics and stable reflection characteristics may be obtained by the islands and the second metal layer covering the islands and formed of Ni. Further, ohmic contact characteristics may be further improved using the second metal layer.

The first metal layer may further comprise Pt, or may consist of Mg.

Portions of the second metal layer covering the islands may be thicker that portion of the second metal layer that are disposed between the islands. Therefore, light incident to regions between the islands may be reflected by the reflective metal layer.

The reflective metal layer may comprise Ag. The light emitting diode may further include a barrier metal layer covering the reflective metal layer. Since the reflective metal layer formed of Ag is positioned between the second metal layer and the barrier metal layer, the thermal stability of the reflective metal layer may be improved.

The light emitting diode may be a vertical-type light emitting diode. Therefore, the light emitting diode may further include: a support substrate; and a bonding metal layer positioned between the support substrate and the barrier metal layer. In the alternative, the light emitting diode may be a flip-type light emitting diode.

The gallium nitride-based compound semiconductor layer may be a p-type semiconductor layer. In addition, the gallium nitride-based compound semiconductor layer may have a c-plane surface as a growth surface. The gallium nitride-based compound semiconductor layer may have an a-plane surface or an m-plane surface as a growth surface, or a growth surface inclined within ±15 degrees with respect to the m-plane surface.

According to another exemplary embodiment of the present invention, there is provided a light emitting diode including: a gallium nitride-based compound semiconductor layer; a first metal layer disposed in the form of islands that are in ohmic contact with the gallium nitride-based compound semiconductor layer; a second metal layer comprising Ni, covering the first metal layer, and contacting the gallium nitride-based compound semiconductor layer between the islands of the first metal layer; and an Ag reflective metal layer covering the second metal layer.

According to still another exemplary embodiment of the present invention, there is provided a method of fabricating a light emitting diode, including: growing a gallium nitride-based compound semiconductor layer on a growth substrate; forming a first metal layer containing Mg on the gallium nitride-based compound semiconductor layer; forming a second metal layer including Ni on the first metal layer; forming a reflective metal layer on the second metal layer; and heat-treating the first metal layer to convert the first metal layer into islands, such that the second metal layer covers the islands and contacts the gallium nitride-based compound semiconductor layer between the islands.

The first metal layer may comprise Mg, and the second metal layer may comprise Ni. The reflective metal layer may comprise Ag.

Further, the first metal layer may further comprise Pt, or may consist of Mg.

The method of fabricating a light emitting diode may further include forming a barrier metal layer on the reflective metal layer. The heat treatment may be performed after the forming of the barrier metal layer.

DETAILED DESCRIPTION OF THE ILLUSTRATED EMBODIMENTS

Figure 1:
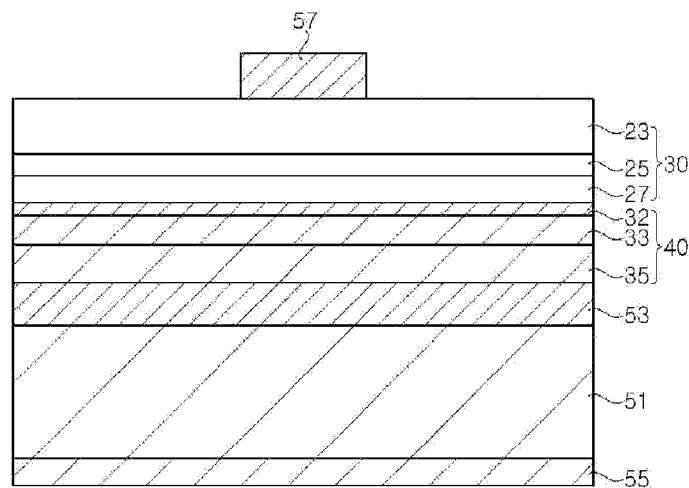
FIG. 1 is a schematic cross-sectional view for describing a light emitting diode according to an exemplary embodiment of the present invention.

Hereinafter, exemplary embodiments of the present invention will be described in detail with reference to the accompanying drawings. Exemplary embodiments to be provided below are provided by way of example so that the idea of the present invention may be sufficiently transferred to those skilled in the art. Therefore, the present invention is not limited to exemplary embodiments to be described below, but may be implemented in other forms. In addition, in the accompanying drawings, widths, lengths, thicknesses, and the like, of components may be exaggerated for convenience. Like reference numerals denote like components throughout the present specification.

Figure 2:
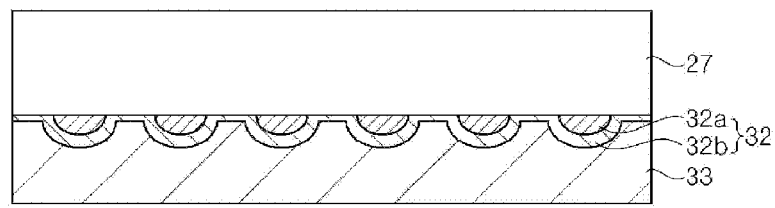
FIG. 2 is an enlarged cross-sectional view of an interface portion between an ohmic reflective structure and a compound semiconductor layer of FIG. 1.

FIG. 1 is a schematic cross-sectional view for describing a light emitting diode according to an exemplary embodiment of the present invention; and FIG. 2 is an enlarged cross-sectional view of an interface between an ohmic reflective structure 40 and a lower semiconductor layer 27.

Referring to FIGS. 1 and 2, the light emitting diode includes a semiconductor stack structure 30 and an ohmic reflective structure 40. In addition, the light emitting diode may include a support substrate 51, a bonding metal layer 53, and electrode pads 55 and 57.

The support substrate 51 is distinguished from a growth substrate for growing compound semiconductor layers and is a secondary substrate attached to the compound semiconductor layers that are already grown. The support substrate 51 may be a conductive substrate, such as a silicon or metal substrate, but is not limited thereto. That is, the support substrate 51 may also be an insulating substrate such as a sapphire substrate.

The semiconductor stack structure 30 is positioned above the support substrate 51. The semiconductor stack structure 30 includes an upper semiconductor layer 23, an active layer 25, and a lower semiconductor layer 27, which are gallium nitride-based compound semiconductor layers. The upper semiconductor layer 23 may be an n-type compound semiconductor layer, and the lower semiconductor layer 27 may be a p-type compound semiconductor layer. In the semiconductor stack structure 30, the p-type compound semiconductor layer 27 is positioned more closely to the support substrate 51 than the n-type compound semiconductor layer 23, which is similar to a general vertical-type light emitting diode.

The semiconductor stack structure 30 may be formed to have the same area as that of the support substrate 51, but is not limited thereto. Particularly, in the case in which the support substrate 51 is an insulating substrate, the semiconductor stack structure 30 may be positioned on a portion of the support substrate 51.

The upper semiconductor layer 23, the active layer 25, and the lower semiconductor layer 27 may be formed of a III-N-based compound semiconductor, for example, a (Al, Ga, In)N semiconductor. Each of the upper semiconductor layer 23 and the lower semiconductor layer 27 may be a single layer or a multi-layer. In addition, the active layer 25 may have a single quantum well structure or a multi-quantum well structure. The n-type upper semiconductor layer 23 has a relatively low resistance and is positioned at an opposite side of the support substrate 51, such that it is easy to form a roughened surface on an upper surface of the semiconductor stack structure 30. The rough surface improves extraction efficiency of light generated in the active layer 25.

The ohmic reflective structure 40 may include an ohmic contact layer 32, a reflective metal layer 33, and a barrier metal layer 35. As shown in detail in FIG. 2, the ohmic contact layer 32 includes a first metal layer 32a and a second metal layer 32b. Particularly, the first metal layer 32a may be in the form of islands. The second metal layer 32b covers the first metal layer 32a and contacts the lower semiconductor layer 27 between the islands.

The first metal layer 32a may be formed of a metal containing Mg, for example, Mg or Mg/Pt. Mg has good reflection characteristics over a wide wavelength region, and has excellent and stable ohmic contact characteristics with the lower semiconductor layer 27. Further, since the first metal layer 32a is formed in the shape of the islands, ohmic characteristics and/or reflection characteristics are not deteriorated due to heat generated during operation of the light emitting diode.

The second metal layer 32b is formed of Ni, for example. Since the second metal layer 32b contacts the lower semiconductor layer 27 in the regions between the islands, it may prevent a metal element of the reflective metal layer 33 from being diffused into the lower semiconductor layer 27. In addition, the second metal layer 32b is formed of Ni to prevent mutual diffusion between a material of the first metal layer 32a, for example, Mg, and a material of the reflective metal layer 33, for example, Ag, thereby making it possible to maintain stable ohmic characteristics and reflection characteristics.

Meanwhile, the second metal layer 32b may be formed to be thicker on the islands than in the regions between the islands. Therefore, light incident to the regions between the islands may be reflected using the reflective metal layer 33, and mutual diffusion between a metal material of the islands and a metal material of the reflective metal layer 33 may be prevented. A thickness of the second metal layer 32b in the regions between the islands may be several Ås to several nms.

Meanwhile, the reflective metal layer 33 may be generally formed of Ag, for example. The reflective metal layer 33 mainly reflects light incident to the regions between the islands of the first metal layer 32a. The barrier metal layer 35 may enclose the reflective metal layer 33, so that the reflective metal layer 33 is buried between the semiconductor stack structure 30 and the support substrate 51. The barrier metal layer 35 may be formed of, for example, Ni, or be formed in a multilayer structure including Ni and/or Ni layers.

The bonding metal layer 53 bonds the support substrate 51 and the ohmic reflective structure 40 to each other. The bonding metal layer 53 may be formed using eutectic bonding of, for example, Au—Sn.

Meanwhile, a bonding pad 55 may be positioned beneath the support substrate 51. The bonding pad 55 may be electrically connected to the ohmic reflective structure 40 through the support substrate 51. Unlike this, in the case in which the support substrate 51 is an insulating substrate, the bonding pad 55 may penetrate through the support substrate 51 or be formed on the support substrate 51, to thereby be electrically connected to the ohmic reflective structure 40. The bonding pad 57 is positioned on the upper semiconductor layer 23 and is electrically connected to the upper semiconductor layer 23.

According to the present exemplary embodiment, the island-shaped first metal layer 32a containing Mg, the second metal layer 32b covering the first metal layer 32a, and the reflective metal layer 33 operate to stabilize the ohmic contact characteristics and the reflection characteristics of the light emitting diode.

Although the ohmic reflective structure 40 is shown as being a vertical-type light emitting diode, the ohmic reflective structure 40 may also be applied to a flip-type light emitting diode.

Figure 3:
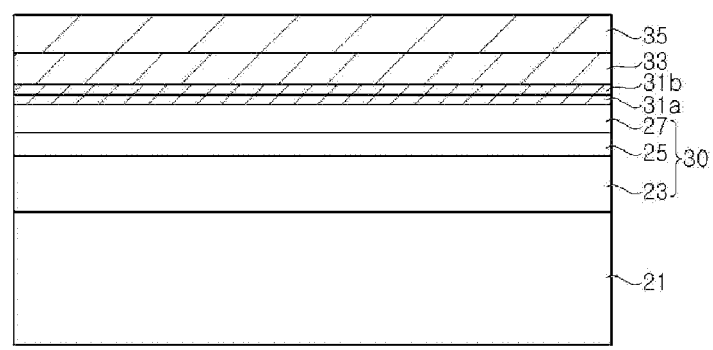
FIGS. 3 and 4 are schematic cross-sectional views for describing a method of fabricating a light emitting diode according to an exemplary embodiment.
Figure 4:
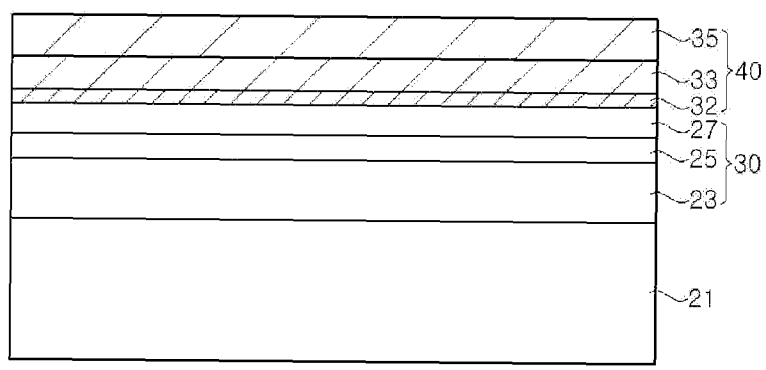
Figure 5:
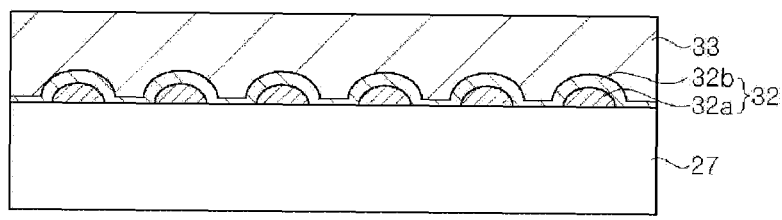
FIG. 5 is an enlarged cross-sectional view of an interface portion between an ohmic reflective structure and a compound semiconductor layer of FIG. 4.

FIGS. 3 and 4 are schematic cross-sectional views for describing a method of fabricating a light emitting diode according to an exemplary embodiment; and FIG. 5 is an enlarged cross-sectional view of an interface between an ohmic reflective structure 40 and a lower semiconductor layer 27 of FIG. 4.

Referring to FIG. 3, the semiconductor stack structure 30 is first grown on a growth substrate 21. The substrate 21 may be any substrate on which a gallium nitride-based compound semiconductor layer may be grown, for example, a patterned sapphire substrate, a spinel substrate, a silicon carbide substrate, a silicon substrate, a gallium nitride substrate, or the like. The substrate 21 may have a growth surface, such as a c-plane surface, an a-plane surface, or an m-plane surface. In addition, a main surface of the substrate 21 may be inclined with respect to the c-plane surface, the a-plane surface, or the m-plane surface. For example, the substrate 21 may have a growth surface inclined by ±15 degrees with respect to the m-plane surface. In addition, the gallium nitride-based compound semiconductor layer may have an a-plane surface or an m-plane surface as a growth surface, or a growth surface inclined within ±15 degrees with respect to the m-plane surface thereof. The gallium nitride-based compound semiconductor layer may have a c-plane surface as a growth surface.

The semiconductor stack structure 30 includes gallium nitride-based compound semiconductor layers, for example, a first semiconductor layer 23, an active layer 25, and a second semiconductor layer 27. The first semiconductor layer 23 may be formed of a gallium nitride-based compound semiconductor layer, that is, a (Al, Ga, In)N-based compound semiconductor layer, and be formed of a single layer or a multilayer. For example, the first semiconductor layer 23 may include a GaN layer and may be formed by doping n-type impurities, for example, Si. The first semiconductor layer 23 corresponds to the upper semiconductor layer 23 of FIG. 1.

The active layer 25 is positioned between the first semiconductor layer 25 and the second semiconductor layer 27, and may have a single quantum well structure in which a single well layer is formed, or a multi-quantum well structure in which well layers and barrier layers are alternately stacked. The well layer may be formed of, for example, InGaN, and the barrier layer may be formed of a gallium nitride-based semiconductor layer having a band gap wider than that of the well layer, for example, GaN.

The second semiconductor layer 27 may include a p-type contact layer, may be formed of a gallium nitride-based compound semiconductor layer, and be formed of a single layer or a multilayer. For example, the second semiconductor layer 27 may include a GaN layer and may be formed by doping p-type impurities, for example, Mg. The second semiconductor layer 27 corresponds to the lower semiconductor layer 27 of FIG. 1.

Then, a first metal layer 31a, a second metal layer 31b, a reflective metal layer 33, and a barrier metal layer 35 may be deposited on the semiconductor stack structure 30. The first metal layer 31a may be formed of a metal layer containing Mg, for example, Mg or Mg/Pt. The first metal layer 31a may be have a thickness of 0.5 to 20 nm. The first metal layer 31a covers the second semiconductor layer 27.

The second metal layer 31b is deposited on the first metal layer 31a at a thickness of several Ås to several nms using Ni. Meanwhile, the reflective metal layer 33 may be deposited on the second metal layer 31b and be formed at a thickness relatively thicker than that of the first metal layer 31a or the second metal layer 31b.

The barrier metal layer 35 may be formed on the reflective metal layer 33. The barrier metal layer 35 may be formed so as to enclose the reflective metal layer 33.

Referring to FIGS. 4 and 5, the first metal layer 31a is heat-treated to form islands 32a. Materials of the first metal layer 31a are aggregated by the heat treatment, such that an island-shaped first metal layer 32a is formed. The heat treatment may be performed at a temperature ranging from, for example, 400 to 700° C. When a heat treatment temperature exceeds 700° C., ohmic characteristics between the first metal layer 32a and the second semiconductor layer 27 may be degraded. In addition, when the heat treatment temperature is less than 400° C., it may become difficult to accomplish a heat treatment effect. For example, the heat treatment may be performed at a temperature of about 600° C., for about ten minutes.

Some of the second metal layer 32b covers the islands of first metal layer 32a, and the remainder of the second metal layer 32b contacts the second semiconductor layer 27 in regions between the islands, after the heat treatment.

The heat treatment may also be performed after the first metal layer 31a and the second metal layer 31b are deposited. However, when the heat treatment is performed after the barrier metal layer 35 is formed oxidation of the first metal layer 31a may be prevented, which simplifies processing.

Then, the support substrate 51 (see FIG. 1) is attached onto the ohmic reflective structure 40 using a bonding metal layer, the growth substrate 21 is removed, and the electrode pad 57 is formed on the first semiconductor layer 23, such that the vertical-type light emitting diode may be completed.

In the alternative, after the semiconductor stack structure 30 may be partially removed to expose a portion of the first semiconductor layer 23, the electrode pad may be formed on the exposed portion of the first semiconductor layer 23, and the electrode pad may be formed on the ohmic reflective structure 40, such that the flip-type light emitting diode may also be formed.

According to exemplary embodiments of the present invention, the first metal layer, the second metal layer, and the reflective metal layer are adopted, thereby making it possible to provide the ohmic reflective structure having stable ohmic contact characteristics and reflection characteristics. Particularly, the first metal layer is formed of the islands containing Mg, and the second metal layer is formed of Ni, thereby making it possible to prevent ohmic contact characteristics or reflection characteristics from being degraded due to heat generated in the light emitting diode.

Although various exemplary embodiments of the present invention have been described hereinabove, the present invention is not limited to these exemplary embodiments. It may be understood by those skilled in the art that these exemplary embodiments may be variously modified without departing the scope and spirit of the present invention.

What is claimed is:

1. A light emitting diode, comprising:
a gallium nitride-based compound semiconductor layer;
a first metal layer disposed in the form of islands comprising Mg that are in ohmic contact with the gallium nitride-based compound semiconductor layer;
a second metal layer comprising Ni, covering the first metal layer, and contacting the gallium nitride-based compound semiconductor layer between the islands of the first metal layer; and
a reflective metal layer covering the second metal layer.

2. The light emitting diode of claim 1, wherein the first metal layer further comprises Pt, or consists of Mg.

3. The light emitting diode of claim 1, wherein portions of the second metal layer that cover the islands are thicker than portions of the second metal layer that are disposed between the islands.

4. The light emitting diode of claim 1, wherein the reflective metal layer comprises Ag.

5. The light emitting diode of claim 1, further comprising a barrier metal layer covering the reflective metal layer.

6. The light emitting diode of claim 5, further comprising:
a support substrate; and
a bonding metal layer disposed between the support substrate and the barrier metal layer.

7. The light emitting diode of claim 1, wherein the gallium nitride-based compound semiconductor layer is a p-type semiconductor layer.

8. The light emitting diode of claim 7, wherein the gallium nitride-based compound semiconductor layer has a c-plane surface as a growth surface.

9. The light emitting diode of claim 7, wherein the gallium nitride-based compound semiconductor layer has an a-plane surface or an m-plane surface as a growth surface, or has a growth surface inclined within ±15 degrees with respect to the m-plane surface.

10. A light emitting diode, comprising:
a gallium nitride-based compound semiconductor layer;
a first metal layer comprising Mg and disposed in the form of islands that are in ohmic contact with the gallium nitride-based compound semiconductor layer;
a second metal layer comprising Ni, covering the first metal layer, and contacting the gallium nitride-based compound semiconductor layer between the islands of the first metal layer; and
an Ag reflective metal layer covering the second metal layer.

11. A method of fabricating a light emitting diode, comprising:
growing a gallium nitride-based compound semiconductor layer on a growth substrate;
forming a first metal layer comprising Mg on the gallium nitride-based compound semiconductor layer;
forming a second metal layer comprising Ni on the first metal layer;
forming a reflective metal layer on the second metal layer; and
heat-treating the first metal layer to convert the first metal layer into islands, such that the second metal layer covers the islands and contacts the gallium nitride-based compound semiconductor layer between the islands.

12. The method of claim 11, wherein the first metal layer further comprises Pt, or consists of Mg.

13. The method of claim 11, wherein the reflective metal layer comprises Ag.

14. The method of claim 11, further comprising forming a barrier metal layer on the reflective metal layer,
wherein the heat treatment is performed after the forming of the barrier metal layer.

* * * * *